(12) United States Patent
Meck

(10) Patent No.: US 7,071,792 B2
(45) Date of Patent: Jul. 4, 2006

(54) METHOD AND APPARATUS FOR IMPEDANCE MATCHING IN AN AMPLIFIER USING LUMPED AND DISTRIBUTED INDUCTANCE

(75) Inventor: Ronald A. Meck, Soquel, CA (US)

(73) Assignee: Tropian, Inc., Cupertino, CA (US)

( * ) Notice: Subject to any disclaimer, the term of this patent is extended or adjusted under 35 U.S.C. 154(b) by 1122 days.

(21) Appl. No.: 09/942,448

(22) Filed: Aug. 29, 2001

(65) Prior Publication Data

US 2004/0121745 A1 Jun. 24, 2004

(51) Int. Cl.
*H04B 1/04* (2006.01)
*H04Q 11/12* (2006.01)

(52) U.S. Cl. .................... 333/32; 455/107; 455/119; 455/129; 455/550.1; 333/124

(58) Field of Classification Search ............. 455/107, 455/114.1, 117, 119, 129, 550.1; 333/32, 333/124, 129
See application file for complete search history.

(56) References Cited

U.S. PATENT DOCUMENTS

| | | | | |
|---|---|---|---|---|
| 5,375,356 A | * | 12/1994 | Arjomand | 40/612 |
| 5,423,074 A | * | 6/1995 | Dent | 455/74 |
| 5,874,926 A | * | 2/1999 | Tsuru et al. | 343/860 |
| 6,023,611 A | | 2/2000 | Bolin et al. | |
| 6,243,566 B1 | * | 6/2001 | Peckham et al. | 455/127.4 |
| 6,259,930 B1 | * | 7/2001 | Bae | 455/575.7 |
| 6,304,748 B1 | * | 10/2001 | Li et al. | 455/113 |
| 6,833,771 B1 | * | 12/2004 | Ohta et al. | 333/33 |
| 2002/0118075 A1 | * | 8/2002 | Ohwada et al. | 333/32 |

FOREIGN PATENT DOCUMENTS

GB 2 187 042 A * 8/1987

OTHER PUBLICATIONS

Copy of International Search Report.

* cited by examiner

*Primary Examiner*—Simon Nguyen

(57) ABSTRACT

An impedance matching circuit (140) includes a capacitive element ($C_1$, 220), having a capacitance C, coupled in parallel with an output node (215) of the matching circuit, and an inductor ($L_1$, 225) coupled in series with a transmission line ($T_1$, 230) between the input node and the output node. The transmission line has a length that, in combination with the inductor, provides impedance substantially equal to the input impedance of the transmission circuit (150) at a frequency of interest. In one embodiment, the inductor is connected to an output (195) of an amplifier (180), and the transmission line is connected to the inductor and to the output (215). The capacitive element is connected to the transmission line such that the length of the transmission line between the inductor and the capacitive element provides the desired inductance.

22 Claims, 6 Drawing Sheets

METHOD AND APPARATUS FOR IMPEDANCE MATCHING IN AN AMPLIFIER USING LUMPED AND DISTRIBUTED INDUCTANCE

BACKGROUND OF THE INVENTION

1. Field of the Invention

The present invention relates generally to impedance matching to amplifiers, and more particularly to an impedance matching circuit and method for matching an output impedance of an amplifier circuit in a wireless communications system to an input impedance of a transmission circuit.

2. State of the Art

Wireless communication systems typically include a chain of amplifier circuit stage through which a received or modulated signal is passed in series. The output of the amplifier stages is coupled to a load, typically via an impedance matching circuit.

Impedance matching circuits help match the output impedance of the amplifier stages to the impedance of the load. An ideal impedance match provides for the maximum transfer of power from the source to the load. In a wireless communication system, for example, it is typically desirable to maximize the power delivered from a final amplifier circuit or power amplifier to an antenna. The maximum power is transferred from the power amplifier to the antenna when, for a given frequency, the input impedance of the antenna is equal to the conjugate of the output impedance of the power amplifier. When these conditions are satisfied power is delivered with 50% efficiency, that is as much power is transferred to the antenna as is dissipated in the internal impedance of the power amplifier.

Generally, the output impedance of a power amplifier will not be what is needed for maximum power transfer. For example, a typical power amplifier used in a handset of a wireless communication system may have an internal impedance of about 3 ohms, whereas the antenna used in the same handset has an input impedance of about 50 ohms. Typically, a matching network comprising capacitors and inductors is inserted between the power amplifier and the antenna to make the power amplifier output impedance appear to be the complex conjugate of the input impedance of the antenna.

But conventional matching circuits may require non-standard values for L and C to achieve a proper impedance match. Consequently, it generally is not possible to design and build a matching network that precisely matches the impedance of the power amplifier to that of the antenna. This problem is exacerbated by the variations in values of the inductors and capacitors due to uncertainties or tolerances in their manufacturing processes. Inductors and capacitors can vary by 10% or more from their specified value. Accordingly, the larger the values of the inductors and capacitors the larger the impact of the manufacturing tolerances on the impedance matching. Thus, implementing a matching network to precisely match impedance of a power amplifier and antenna to achieve maximum power transfer can be a challenge.

Ideally, inductors and capacitors used in a matching circuit would have no resistance and the matching circuit would therefore dissipate little or no power. But, in reality, a matching circuit can dissipate several percent of the power being transferred to the load or antenna. Thus, to minimize dissipation of power it is generally desirable to keep inductor's and capacitor's values as small as possible.

A particular problem with conventional matching networks used in wireless communications systems is that the transceivers or transmitters must often operate at multiple frequencies. For example, a dual band GSM/DCS radiotelephone handset uses the Global System for Mobile Communications (GSM) standard around 900 MHz, and the Digital Communications System (DCS) standard, which is similar to GSM except that it operates around 1800 MHz.

Accordingly, there is a need for a matching circuit and method that can provide equal or substantially equal impedance between an amplifier circuit and a transmission circuit, thereby increasing power efficiency and reducing signal distortion. There is a further need for a matching circuit and method with the ability to match impedance for signals at multiple frequencies. It is further desirable that the matching circuit and method reduce the number or size of components used in the matching circuit, including the length of any transmission line used.

The present invention provides such a circuit and method.

SUMMARY OF THE INVENTION

The present invention provides an apparatus and method for matching output impedance of an amplifier in a wireless communication system to an input impedance of a transmission circuit.

In one aspect, the invention provides method, apparatus, and circuit for impedance matching using lumped and distributed inductance. In another aspect, this is applied to an amplifier using lumped and distributed inductance. Using a transmission line with a fixed inductor allows for non-standard L values to be realized; furthermore, the fixed inductor allows for a shorter transmission line than were a transmission line alone to be used.

In another aspect, the invention provides an impedance matching circuit having an input adapted to receiving a signal from an amplifier circuit and an output adapted to coupled the signal to a transmission circuit. The impedance matching circuit includes a capacitive element ($C_1$) electrically coupled to and in parallel without the output of the impedance matching circuit, and a series combination of an inductor ($L_1$) and a transmission line ($T_1$) electrically coupled between and in series with the input and the output. Capacitance and transmission line lengths are selected such that in combination with the inductor a predetermined amount of total inductance L is provided. Generally, L and C are selected to provide an impedance equal to or substantially equal to an input impedance of the transmission circuit at a first frequency ($f_1$) of a signal transmitted from or received by the amplifier circuit. Advantageously, the impedance is equal, but in practice a small deviation from equality may be acceptable as even this substantial equality provides better matching than conventional approaches.

In one embodiment, the inductor has a first end electrically connected to an output of the amplifier circuit and a second end electrically connected to the transmission line. The transmission line has a first end electrically connected to the second end of the inductor and second end electrically connected to the output of the impedance matching circuit. The capacitive element is electrically connected to the transmission line such that the length of transmission line between the second end of the inductor and the capacitive element provides, in combination with the inductor, the desired inductance.

In one embodiment, the transmission line is advantageously implemented using a conductor over a ground plane on a printed circuit board (PCB), and the capacitive element is a chip capacitor mounted on the printed circuit board. The transmission line of this type may even more advantageously be implemented as a co-planar grounded waveguide, and one end or lead of the chip capacitor is soldered (or otherwise electrically connected) to the ground plane on the printed circuit board. Alternatively, the capacitive element is a segment of shorted waveguide branching off from the transmission line at a point selected to provide the appropriate length to provide the desired total inductance.

In another embodiment, the impedance matching circuit further includes a second capacitive element ($C_2$) electrically connected to the transmission line and in parallel with the first capacitive element, and a switch ($S_1$) through which the second capacitive element is coupled to ground. When opened, the switch decouples the second capacitive element from ground, thereby effectively removing the second capacitive element from the circuit. The second capacitive element is electrically connected to the transmission line such that the length of the transmission line between the second end of the inductor and the second capacitive element is selected to, in combination with the inductor, provide a second predetermined amount of inductance, L', such that L' and C are selected to provide an impedance equal or substantially equal to the input impedance of the transmission circuit at a second, generally higher frequency ($f_2$). In yet another embodiment, the impedance matching circuit further includes a second switch ($S_2$) capable of electrically decoupling the first capacitive element from ground to remove it from the impedance matching circuit when the first switch is closed coupling the second capacitive element to ground and introducing it into the circuit. Optionally, the first switch is a single pole double throw switch capable of alternately electrically decoupling $C_1$ and $C_2$ to ground to alternately remove $C_1$ or $C_2$ from the impedance matching circuit.

The present invention is particularly useful in a transceiver for use in a wireless communication system. Generally, the transceiver further includes an amplifier circuit adapted to amplify signals received and transmitted by the transceiver, and a transmission circuit, including an antenna, adapted to receive and transmit signals received and transmitted by the transceiver. The impedance matching circuit is electrically coupled between and in series with an output of the amplifier circuit and an input of the transmission circuit.

In another aspect a method is provided for matching an output impedance of an amplifier circuit to an input impedance of a transmission circuit. In general, the method involves providing a series combination of an inductor ($L_1$) and a transmission line ($T_1$) coupled between and in series with an output of the amplifier circuit and an input of the transmission circuit. The transmission line is selected to have a length that, in combination with the inductor, provides a predetermined amount of total inductance, L. A capacitive element ($C_1$) is electrically coupled to and in parallel with the output of the amplifier circuit, the capacitive element having a capacitance C, selected such that L and C provide the amplifier circuit with an output impedance substantially equal to an input impedance of the transmission circuit at a frequency ($f_1$).

In one embodiment, the inductor has a first end connected to an output of the amplifier circuit and a second end connected to the transmission line, and the transmission line has a first end connected to the second end of the inductor and second end connected to the output of the impedance matching circuit. The step of electrically coupling the capacitive element to and in parallel with the output of the amplifier circuit involves the step of electrically connected the capacitive element to the transmission line such that the length of the transmission line between the second end of the inductor and the capacitive element is selected to provide the desired amount of inductance.

In one embodiment, the transmission line includes an inductor over a ground plane on a printed circuit board (PCB), and the step of electrically coupling the capacitive element to the output of the amplifier circuit involves mounting a chip capacitor on the PCB such that a first end or lead o the capacitor is electrically connected to the conductor of the transmission line and a second end of the capacitor is electrically connected to the ground plane. Preferably, the transmission line is a co-planar grounded waveguide, and one end of the chip capacitor is soldered to the conductor of the waveguide and the other end is soldered (or otherwise electrically connected) to the ground plane on the printed circuit board.

In another embodiment, the method includes the further steps of electrically connecting a first end or lead of a second capacitive element ($C_2$) to the transmission line and electrically coupling the other end of the second capacitive element to the ground plane through a switch ($S_1$). The second capacitive element is connected in parallel with the first capacitive element and the output of the amplifier circuit such that the length of the transmission line between the end of the inductor and the second capacitive element provides a second predetermined amount of inductance, L', such that L' and C provide an impedance equal to the input impedance of the transmission circuit at a second, typically higher frequency ($f_2$).

In yet another embodiment, the impedance matching circuit further includes a second switch (S2) capable of electrically decoupling the first capacitive element, $C_1$, from the ground plane, thereby removing it from the circuit. Alternatively, the impedance matching circuit can include a solitary single pole double throw switch capable of alternately electrically decoupling $C_1$ and $C_2$ from the ground plane, thereby alternately removing $C_1$ or $C_2$ from the circuit, and the step of electrically coupling the second capacitive element to the ground plane involves electrically decoupling the first capacitive element from the ground plane.

The advantages of the present invention include: (i) improved impedance matching between the amplifier circuit and the transmission circuit resulting in increased power efficiency and reduced signal distortion; (ii) elimination of, or reduction in size and inductance values for, an inductor used in the matching circuit, resulting in decreased costs; and, (iii) ability to match impedance for signals at multiple frequencies by switching a number of capacitive elements coupled to different points on the transmission line in and out of the circuit.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

The present invention is directed to an impedance matching circuit and method for matching an output impedance of an amplifier circuit.

Figure 1:
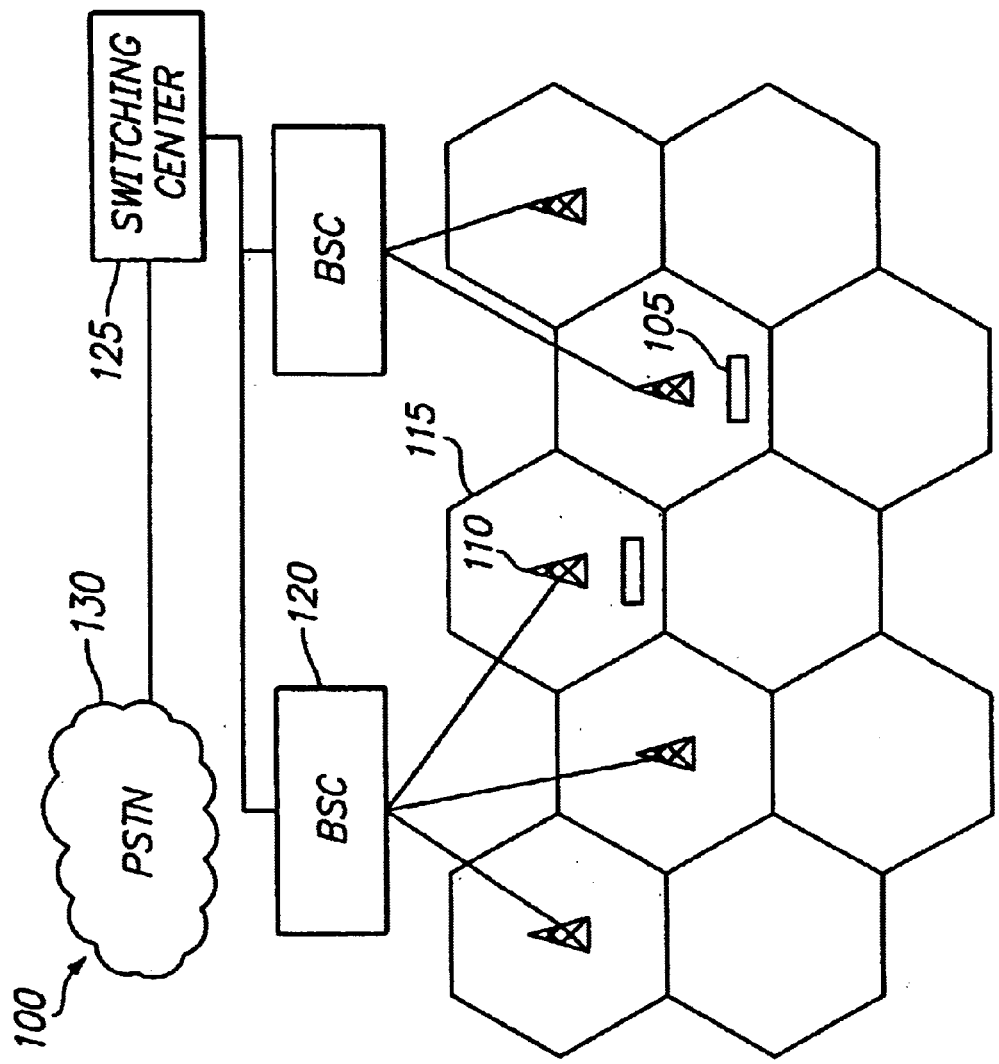
FIG. 1 is an exemplary block diagram showing one example of a type of a wireless communication system with which an apparatus and method according to an embodiment of the present invention may be used.

FIG. 1 shows an exemplary embodiment block diagram of a wireless communication system 100, here a mobile telecommunication system, for which an apparatus and method according to an embodiment of the invention are particularly useful. Details of mobile telecommunication systems are widely known and will not be described further herein.

Referring to FIG. 1, the wireless communication system 100 generally includes a number of first wireless communication devices, for example mobile handsets 105, and one or more second wireless communication devices, or base stations 110, distributed over a geographic area to form cells 115. The base stations 110 are coupled through base station controllers 120 to a switching center 125 that is connected to a public switched telephone network (PSTN 130) and routes telephone calls to the base stations covering a cell 115 occupied by the called or calling handset 105. To enable the system 100 to locate a particular handset 105, each transceiver, that is each base station 110 and handset, in the system has its own unique identifying number. For example, each base station 110 has an area identity number that it transmits regularly as part of the system's control information. Upon switching on, a handset 105 will lock onto the signal of the nearest base station 110 and identify itself to the system 100 by transmitting a registration number to the base station. As it moves from cell to cell, the handset 105 selects new base stations 110 to lock onto the handset 105 checks the area identity number transmitted by the base station 110, and when it detects a change indicating that it has moved to a new cell 115, it will automatically inform the system 100 of its new location by means of a signaling interchange with the base station. In this way, the system can keep a record (registration) of the current cell 115 in which each handset 105 is located, and therefore will only need to call the handset within that cell.

Figure 2:
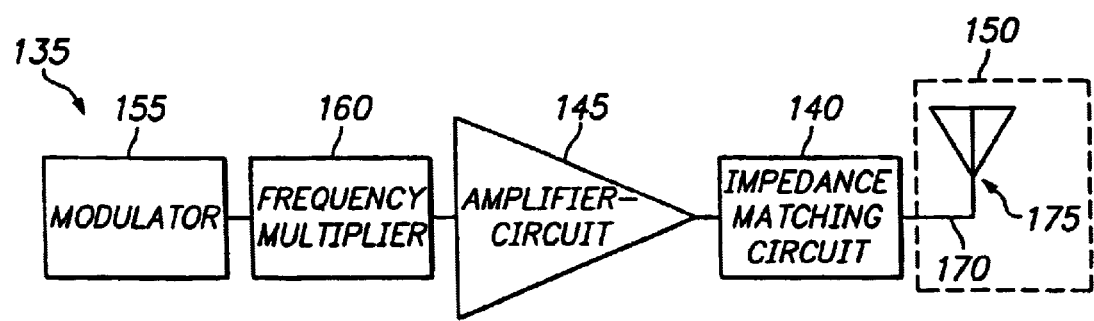
FIG. 2 is a block diagram of a transceiver having an impedance matching circuit according to an embodiment of the present invention

A transceiver or transmitter 135 for use in the mobile handsets 105, base stations 110, base station controllers 120 or switching center 125 of the above wireless communication system 100 will now be described with reference to FIG. 2. As shown in FIG. 2, transmitter 135 has an impedance matching network or matching circuit 140 according to an embodiment of the present invention which can be advantageously used to provide an output impedance to an amplifier circuit 145 that is equal to or substantially equal to an input impedance of a transmission circuit 150. Details of transmitters 135 are widely known and will not be described herein.

Transmitters 135 may further include a modulator 155 to modulate a low power carrier wave signal, and a frequency multiplier 160 to raise the frequency of the modulated signal to improve by enabling the modulator 160 to raise the frequency of the modulated signal, enabling the modulator 155 and subsequent amplifier circuits 145 or stages to operate at different frequencies. The frequency-multiplied signal is then passed through a series of amplifier circuits, only one of which is shown, to raise signal and amplitude and to filter the signal by attenuating or suppressing undesired frequencies. Transmitter 135 further includes a single amplifier circuit 145 having an amplifier and a filter (not shown), coupled to the transmission circuit 150 by an embodiment of an impedance matching circuit 140 according to the present invention. The transmission circuit 150 includes a transmission line 170 and an antenna 175 to broadcast the signal.

Figure 3:
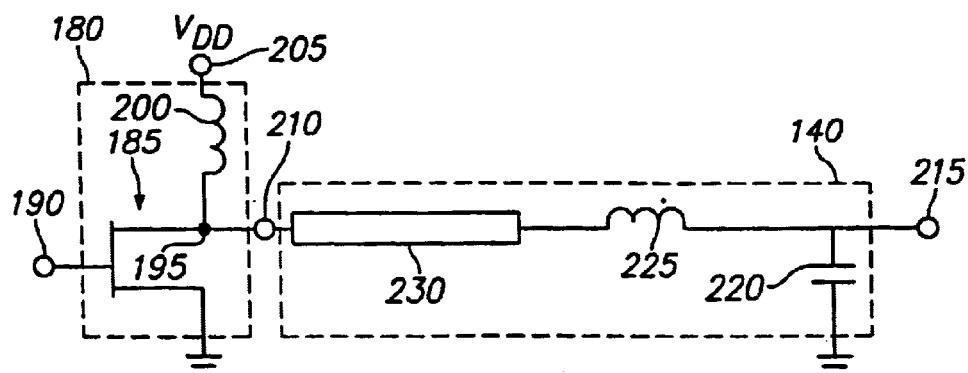
FIG. 3 is a schematic diagram of an amplifier and an impedance matching circuit according to an embodiment of the present invention.

An embodiment of the impedance matching circuit 140 will now be described with reference to FIG. 3 which depicts an amplifier 180 found within amplifier circuit 145 (see FIG. 2), and the impedance matching circuit 140 according to an embodiment of the present invention. The amplifier 180 typically includes an amplifying or active element 185, such as a bipolar or field effect transistor, having an input 190 and an output 195 coupled through an inductor 200 to a voltage source 205, shown here as $V_{DD}$. While shown here as a single active element 185, it will be appreciated that the amplifier 180 can include any number of active elements, formed either as discrete elements or as an integrated circuit (IC), and cascaded or otherwise combined to further increase gain of the stage.

Generally, the impedance matching circuit 140 includes an input node 210 coupled to the output 195 of the active element 185 and an output node 215 coupled to the transmission circuit 150 (not shown in this figure). Circuit 180 further includes a capacitive element ($C_1$) 220 having a predetermined amount of capacitance, C, electrically coupled in parallel with the output node 215. The matching circuit 140 further includes a series combination of an inductor ($L_1$) 225 and a transmission line ($T_1$) 230 electrically coupled between the input node 210 and the output node 215. The transmission line has a length selected to provide a predetermined amount of inductance, L in combination with the inductor. While shown as separate and distinct from electrical pathways connecting the matching circuit 140 to the output 195 of the active element 185, and the inductor to 225 to the capacitive element 220, it will be appreciated that the transmission line 230 includes the full length of the transmission line extending from output 295 to the capacitive element 220. That is, the transmission line 230 includes line length from the output 195 to the inductor 225, and from the inductor to the capacitive element 220. This length of the transmission line is selected to provide, in combination with the inductor, a predetermined amount of inductance, L, at a frequency ($f_1$) of the signal being transmitted. Inductance L and capacitance C are selected, in view of the frequency of interest to provide an output impedance for the amplifier circuit 145 that is substantially equal to an input impedance of the transmission circuit 150 so that the desired level of matching is achieved.

As noted above, the amplifier circuit 145 can include a filter prior to the matching circuit 140 to remove undesired frequencies in the output. In a preferred embodiment, the values of the inductance L and capacitance C of the matching circuit 140 are also selected in view of the signal frequency to filter undesired frequencies (if present). The filter can be a high pass filter (HPF) passing only those frequencies above a predetermined minimum frequency, a low pass filter (OPF) passing frequencies below a predetermined maximum frequency, or a band pass filter (BPF) designed to pass only those frequencies in a predetermined range of frequencies. The filter may also or alternatively be designed to pass or block selected frequency ranges. For example, proper selection of the values of the inductance L and capacitance C of the matching circuit 140 shown in FIG. 3 can provide a single pole LPF attenuating or suppressing all frequencies above a predetermined maximum frequency.

The present invention advantageously permits tailoring the inductance L of the matching circuit 140 to precisely match impedance of the amplifier circuit 145 to the transmission circuit 150, without limitation as to available standard inductance values. Thus, maximum power transfer between the amplifier circuit and the transmission circuit can be implemented using standard value components. A further advantage is the size reduction in value of the inductor 225, which further improves the efficiency of the matching circuit 140 by reducing the amount of power dissipated in the matching circuit.

If desired, inductor 225 can be eliminated entirely by proper selection of the length of the transmission line 230, thereby further improving the efficiency of the matching circuit 140, and reducing manufacturing cost.

Figure 4:
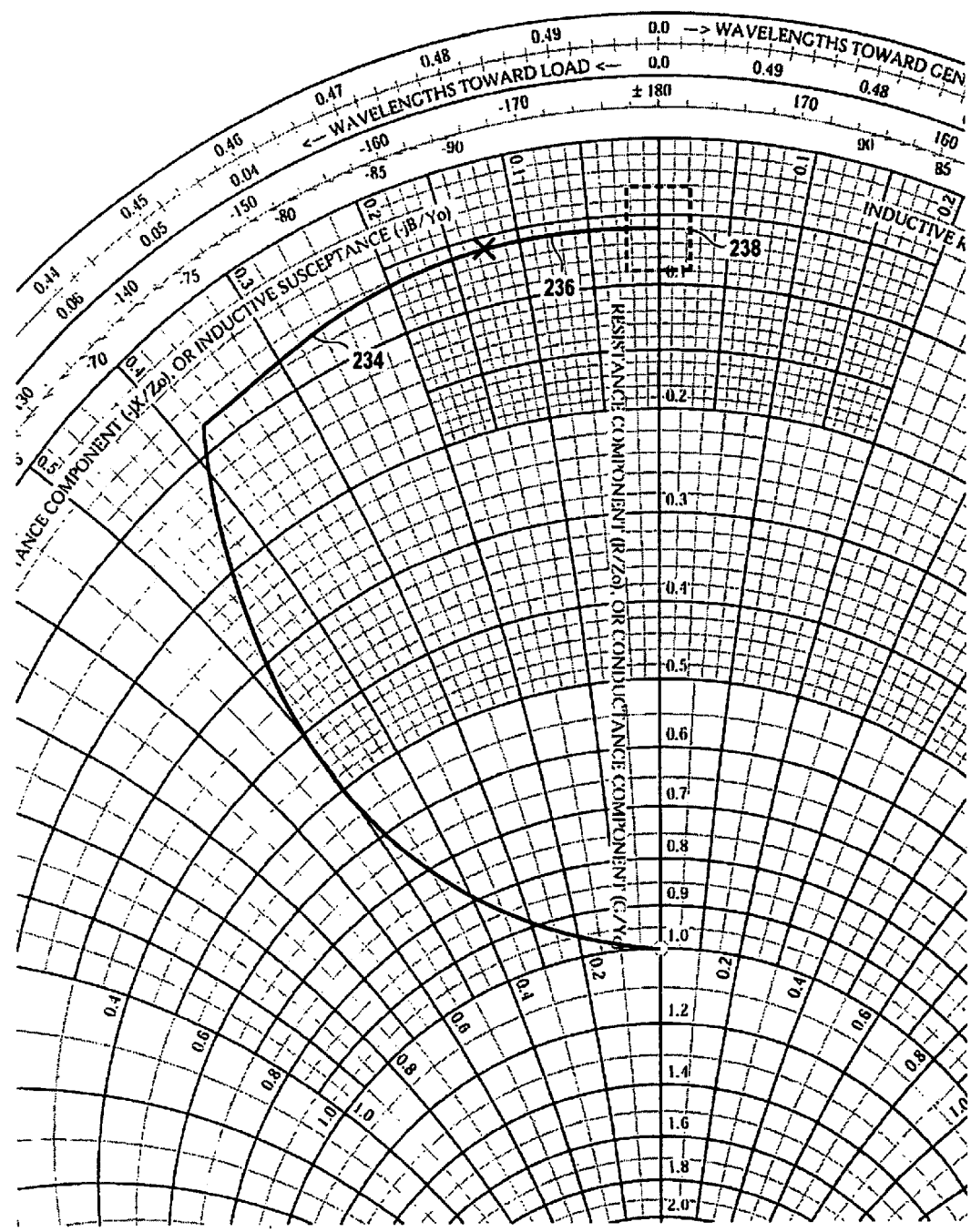
FIG. 4 illustrates a Smith Chart for an impedance matching circuit similar to that shown in FIG. 3.

The ability of the present invention to precisely matching the output impedance of the amplifier circuit 145 to the transmission circuit 150 will now be described with reference to the Smith Chart shown in FIG. 4. A Smith Chart is a polar plot of circles representing constance resistance, such as that of the transmission line 230, and arcs representing constant reactance, such as that of the inductor 225 and capacitive element 220. FIG. 4 shows graphed values for inductance and capacitance for the inductor 225, transmission line 230, and the capacitive element 220 of an impedance matching circuit 140 similar to that shown in FIG. 3. Line 232 represents the normalized capacitance of capacitive element 220, line 234 represents the normalized inductance of inductor 225, and line 236 represents the electrical length of the transmission line 230. It will be appreciated that by varying the values of the capacitive element 220, the inductor 225, and/or the length of the transmission line 230, matching circuit 140 enables precise impedance matching. For example, to match the typically 3 ohm output impedance of a power amplifier used in a handset 105 of a wireless communication system 100 to an antenna, one selects the ideal 50 ohm impedance components values and length of the transmission line 230 length such that the plot of the matching circuit terminates in a range of from about 0.03 to about 0.09 along the horizontal axis of the Smith Chart, indicated as region 232 in FIG. 4.

Figure 9:
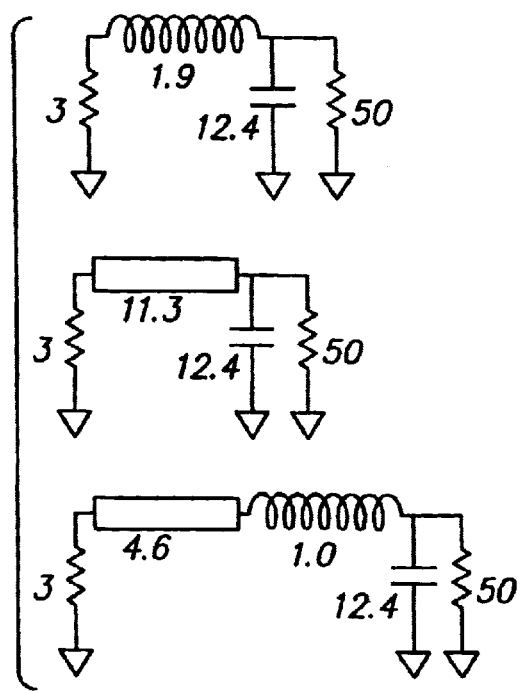
FIG. 9 illustrates three equivalent impedance matching circuits in a specific example.

FIG. 9 illustrates three equivalent 3 ohm to 50 ohm matching circuits for a frequency of 1 GHz. The first circuit using lumped elements only, including a series inductor having a value of about 1.9 nH and a shunt capacitor having a value of about 12.4 pF. In the second circuit, the lumped inductor has been replaced by a transmission line having a length of 11.3 mm. In the third circuit, the lumped inductor of the first circuit has been replaced by the combination of a shorter transmission line (4.6 mm) and a smaller-valued inductor (1.0 nH). The shorter transmission line allows for a more compact realization, and the smaller inductor minimizes losses.

Alternative embodiments for the matching circuit 140 will now be described with reference to FIG. 5, FIG. 6, and FIG. 7.

Figure 5:
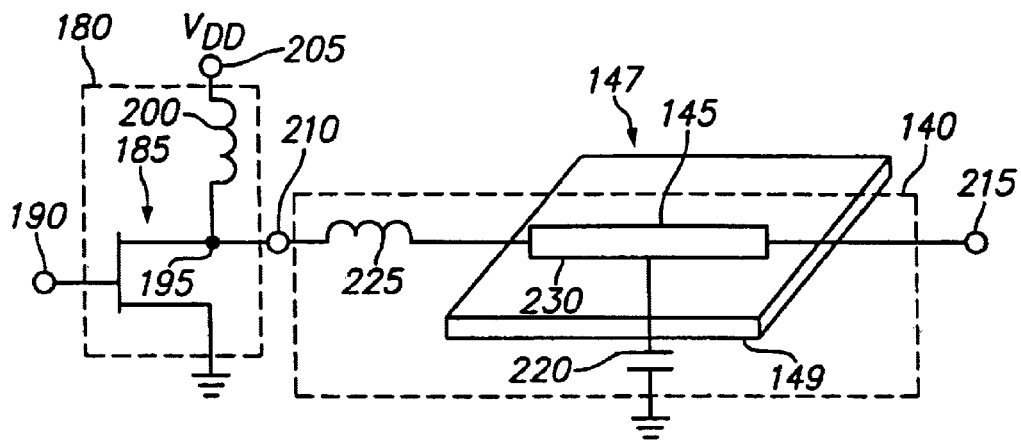
FIG. 5 is a schematic diagram of an amplifier and an exemplary impedance matching circuit according to another embodiment of the present invention.

In the embodiment of FIG. 5 impedance matching circuit 140 has a transmission line 230 that includes a trace 145 on a printed circuit board (PCB). Length of the transmission line is determined by selecting the point at which the capacitive element 220 is electrically connected to the trace on the PCB. Preferably, the transmission line 230 includes a conductor trace 145 over a ground plane 149 on the PCB 147 where the capacitive element 220 is mounted on the PCB and has one end or terminal electrically connected to the conductor and another terminal electrically connected to the ground plane. More preferably, transmission line 230 is a co-planar grounded waveguide on a PCB, and the capacitive element 220 is a chip capacitor soldered thereto.

Figure 6:
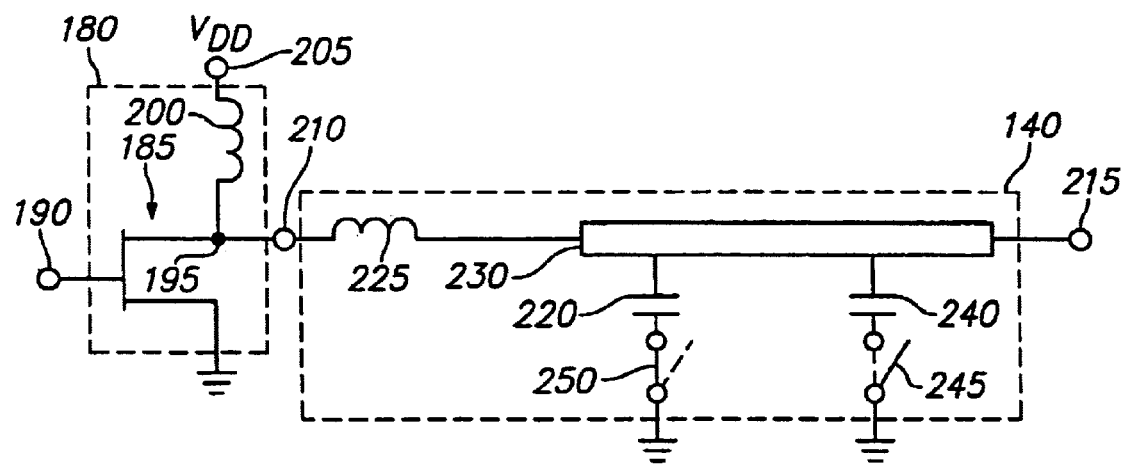
FIG. 6 is a schematic diagram of a dual frequency amplifier and an exemplary impedance matching circuit according to yet another embodiment of the present invention.
Figure 7:
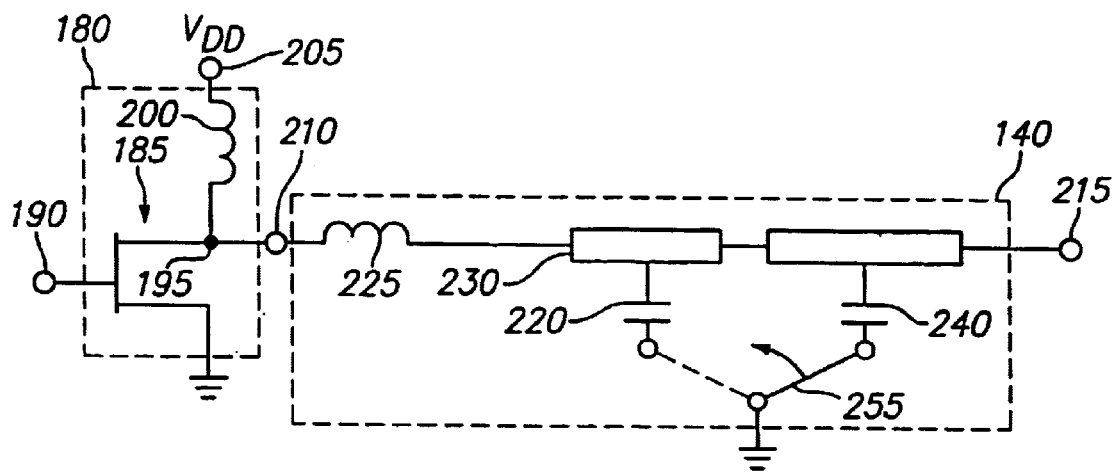
FIG. 7 is a schematic diagram of an alternative embodiment of the amplifier and the impedance matching circuit of FIG. 6.

FIG. 6 is a schematic diagram of an impedance matching circuit according to yet another embodiment of the present invention suitable for use with a dual frequency amplifier circuit. In this embodiment, the matching circuit 140 includes a second capacitive element 240 switchingly coupled parallel with the first capacitive element 220 by a switch 245. The second capacitive element 240 has a capacitance C' and is coupled to the transmission line 230 at a location different than where first capacitor 270 is coupled to the line. The length of the transmission line 230 between the inductor 225 and the second capacitive element 240 is selected in combination with the inductor to provide a second predetermined inductance, L', such that L' and C' match the impedance of the amplifier circuit 145 and the transmission circuit 150 at a second frequency ($f_2$). This embodiment is particularly useful in dual band GSM/DCS radiotelephone handsets using the Global System for Mobile Communications (GSM) standard around 900 MHz, and the Digital Communications System (DCS) standard around 1800 MHz. Thus, the circuit will provide impedance matching at two frequencies, depending upon whether switch 245 is open or closed.

Optionally, the matching circuit 140 further includes a second switch 250 that can electrically decoupled the first capacitive element 220 from the impedance matching circuit.

To take a specific example of dual-band operation at 900 and 1800 MHz, an amplifying circuit having an output impedance of 3 ohms and a transmission circuit having an input impedance of 50 ohms, the inductor 225 may have a value of 0.82 nH, and the capacitors 220 and 240 may have values of 2.6 pF and 10 pF, respectively. The switch 250 is assumed to always be closed. The length of the transmission line may be 1.9 mm from the beginning to the capacitor 220, and 7.4 mm between the capacitors 220 and 240. The switch 245 is assumed to be closed for 900 MHz and open for 1800 MHz.

Although the switches 245, 250 are shown connected between the respective capacitive elements 220, 240 and ground, it will be appreciated that one or both of the switches could alternatively be connected between the capacitive elements and the transmission line 230 to remove the associated capacitor from the matching circuit 140. In yet another alternative embodiment, a solitary single pole double throw switch 255 can be used, as shown in FIG. 7, to alternately electrically couple and decouple the first and second capacitive elements 220, 240 from the impedance matching circuit 140, to impedance match at a frequency determined by the switch connections.

Figure 8:
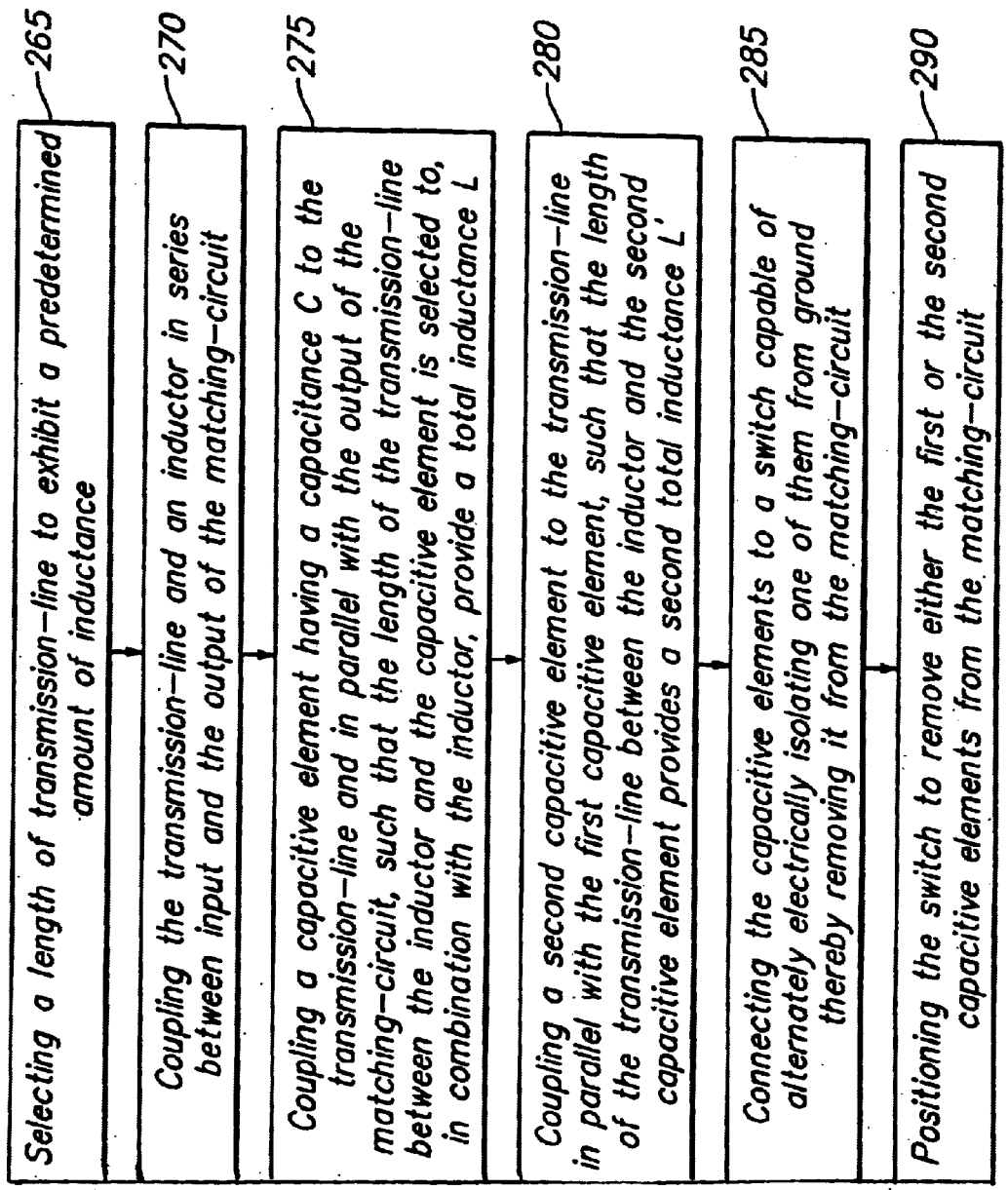
FIG. 8 is a flowchart of a method for matching an output impedance of an amplifier to an input impedance of an antenna according to the embodiment of the present invention.

A method or process for operating the impedance matching circuit 140 will now be described with reference to FIG. 8. FIG. 8 shows a diagrammatic flow-chart of a method for matching the output impedance of the amplifier circuit 145 to the input impedance of the transmission circuit 150 according to an embodiment of the present invention. The method generally involves selecting a length of transmission line 230 to have a predetermined amount of inductance, at step 265. Step 270 involves coupling the transmission line and an inductor 225 in series between the input 210 and the output 215 of the matching circuit 140. At step 275, a capacitive element 220 having a capacitance C is coupled to the transmission line, in parallel with the output of the matching circuit. At step 275, the length of the transmission line between the inductor and the capacitive element is selected to provide a total inductance L, in combination with the inductor. The capacitive element 220, inductor 225 and the length of the transmission line 230 are selected such that the values of L and C provide an output impedance equal to an input impedance of the transmission circuit 150 for a signal at a first frequency ($f_1$). Preferably, where the transmission line 230 is a conductor trace on a printed circuit board (PCB), step 275 of electrically coupling the capacitive element 220 to the transmission line includes mounting a capacitor on the PCB such that a first lead of the capacitor is electrically connected to the conductor and a second end of the capacitor is electrically connected to ground. More preferably, the transmission line is a co-planar grounded waveguide including a conductor over a ground plane. In such configuration, step 275 of coupling the capacitive element to the output of the amplifier circuit involves soldering one end of a chip capacitor to the conductor and electrically connecting the other end to the ground plane.

Optionally, the method can include the further steps of coupling a second capacitive element 240 to the transmission line 230 in parallel with the first capacitive element 220. Coupling of the transmission line between the inductor 225 and the second capacitive element provides a second total inductance L' selected to match the impedance of the amplifier circuit 145 and the transmission circuit 150 at a second frequency ($f_2$), as shown in step 280. Connecting the first and second capacitive elements 220, 240 to a single pole double throw switch 255 that can electrically isolate one of the capacitive elements from the matching circuit 140 is shown at step 285. At method step 290, the switch 255 is positioned to remove the first or the second capacitive elements 220, 240 from the matching circuit 140, to change the frequency at which matching occurs.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. An impedance matching circuit comprising:
    an input node adapted to receive an input signal from an amplifier circuit;
    an output node adapted to couple an output signal to a transmission circuit;
    a first capacitive element electrically coupled in parallel with said output node and having a capacitance C;
    an inductor and a transmission line electrically coupled between and in series with the input node and the output node, said transmission line having a length selected in combination with the inductor to provide a predetermined amount of inductance, L;
    wherein values of L and C provide an impedance substantially equal to an input impedance of the transmission circuit at a first frequency.

2. The apparatus of claim 1, wherein the inductor has a first end electrically connected to said input node receiving said input signal output by the amplifier circuit and a second end electrically connected to the transmission line, and the transmission line has a first end electrically connected to the second end of the inductor and a second end electrically connected to the output node of the impedance matching circuit, and wherein the capacitor is electrically connected to the transmission line such that the length of the transmission line between the second end of the inductor and the capacitor is selected to, in combination with the inductor, provide the predetermined amount of inductance.

3. The apparatus of claim 2, wherein the transmission line comprises a conductor over a ground plane on a printed circuit board, and the capacitive element is mounted on the PCB.

4. The apparatus of claim 3, wherein the transmission line comprises a co-planar grounded waveguide.

5. The apparatus of claim 4, wherein the capacitive element comprises a shorted waveguide electrically connected to an projecting substantially perpendicularly from the transmission line.

6. The apparatus of claim 2, further comprising a second capacitive element electrically connected to the transmission line and in parallel with the first capacitive element, and a first switch for electrically coupling the second capacitive element to ground, wherein the second capacitive element is electrically coupled to the transmission line such that the length of the transmission line between the second end of the inductor and the second capacitive element is selected to, in combination with the inductor, provide a second predetermined amount of inductance, L', such that L' and C are selected to provide an impedance equal to the input impedance of the transmission circuit at a second frequency.

7. The apparatus of claim 6, further comprising a second switch for electrically decoupling the first capacitive element from ground to electrically remove the first capacitive element from the impedance matching circuit.

8. The apparatus of claim 6, wherein the switch is a single pole double throw switch capable of alternately electrically decoupling the first and second capacitive elements to alternately remove the first or second capacitive element from the impedance matching circuit.

9. A method of matching an output impedance of an amplifier circuit to an input impedance of a transmission circuit, comprising:
    providing a series combination of an inductor and a transmission line coupled between and in series with an output of the amplifier circuit and an input of the transmission circuit, the transmission line having a length selected, in combination with the inductor, to provide a predetermined amount of inductance, L; and
    electrically coupling a first capacitive element to an in parallel with the output of the amlifier circuit, the capacitive element having a capacitance C, so that L and C provide an impedance substantially equal to an input impedance of the transmission circuit at a first frequency.

10. The method of claim 9, wherein the inductor has a first end connected to an output of the amplifier circuit and a second end connected to the transmission line, and the transmission line has a first end connected to the second end the inductor and a second end connected to the output of the impedance matching circuit, wherein the step of electrically coupling the first capacitive element to and in parallel with the output of the amplifier circuit comprises electrically connecting the first capacitive element to the transmission line such that the length of the transmission line between the second end of the inductor and the first capacitive element is selected to, in combination with the inductor, provide the predetermined amount of inductance.

11. The method of claim 10, wherein the transmission line comprises a conductor over a ground plane on a printed circuit board, and the step of electrically coupling the first capacitive element to and in parallel with the output of the amplifier circuit comprises mounting the first capacitive element on the printed circuit board such that a first end of the first capacitive element is electrically connected to the conductor of the transmission line and a second end of the first capacitive element is electrically connected to the ground plane.

12. The method of claim 10, further comprising:
electrically connecting a second capacitive element to the transmission line and in parallel with the first capacitive element such that the length of the transmission line between the second end of the inductor and the second capacitive element is selected to, in combination with the inductor, provide a second predetermined amount of inductance, L'; and
electrically coupling the second capacitive element to the ground plane through a switch;
wherein the inductance L' and the capacitance C provide an impedance substantially equal to the input impedance of the transmission circuit at a second frequency.

13. The method of claim 12, wherein the switch comprises a single pole double throw switch capable of alternately electrically decoupling the first and second capacitive elements from the ground plane, and electrically coupling the second capacitive element to the ground plane comprises electrically decoupling the first capacitive element from the ground plane.

14. A transceiver for use in a wireless communication system, the transceiver comprising:
an amplifier circuit for amplifying signals transmitted by the transceiver;
a transmission circuit for transmitting signals transmitted by the transceiver, the transmission circuit including an antenna; and
an impedance matching circuit electrically coupled between and in series with an output of the amplifier circuit and an input of the transmission circuit, the impedance matching circuit comprising:
a first capacitive element electrically coupled to and in parallel with the output of the amplifier circuit, the capacitive element having a capacitance C;
a series combination of an inductor and a transmission line electrically coupled between and in series with the input of the transmission circuit and the output of the amplifier circuit, the transmission line having a length selected, in combination with the inductor, to provide a predetermined amount of inductance, L;
wherein L and C are selected to provide an impedance equal to the input impedance of the transmission circuit at a first frequency.

15. The apparatus of claim 14, wherein the inductor has a first end electrically connected to an output of the amplifier circuit and a second end electrically connected to the transmission line, and the transmission line has a first end connected to the second end of the inductor and a second end connected to the output of the impedance matching circuit, wherein the first capacitive element is electrically connected to the transmission line such that the length of the transmission line between the second end of the inductor and the first capacitive element is selected to, in combination with the inductor, provide the predetermined amount of inductance.

16. The apparatus of claim 15, wherein the transmission line comprises a conductor over a ground plane on a printed circuit board, and the capacitive element is mounted on the printed circuit board.

17. The apparatus of claim 16, wherein the transmission line comprises a co-planar grounded waveguide.

18. The apparatus of claim 17, wherein the first capacitive element comprises a shorted waveguide electrically connected to and projecting from the transmission line.

19. The apparatus of claim 15, further comprising a second capacitive element electrically connected to the transmission line and in parallel with the first capacitive element, and a switch for electrically coupling the second capacitive element to ground, wherein the second capacitive element is electrically connected to the transmission line such that the length of the transmission line between the second end of the inductor and the second capacitive element is selected to, in combination with the inductor, provide a second predetermined amount of inductance, L', such that L' and C are selected to provide an impedance equal to the input impedance of the transmission circuit at a second frequency.

20. The apparatus of claim 19, wherein the switch is a single pole double throw switch for alternately electrically decoupling the first and second capacitive elements to alternately remove the first or second capacitive element from the impedance matching circuit.

21. An impedance matching circuit comprising:
an input node for receiving an input signal from an amplifier circuit;
an output node for coupling an output signal to a transmission circuit;
a capacitive element electrically coupled in parallel with said output node and having a capacitance C;
an inductor and a transmission line electrically coupled between and in series with the input node and the output node, the transmission line having a length selected in combination with the inductor to provide a predetermined amount of inductance, L, values of L and C being selected to provide in impedance substantially equal to an input impedance of the transmission circuit at a frequency;
said inductor having a first end electrically connected to said input node and a second end electrically connected to the transmission line, said transmission line having a first end electrically connected to the second end of the inductor and a second end electrically connected to the output node of the impedance matching circuit, and the capacitive element being electrically connected to the transmission line such that the length of the transmission line between the second end of the inductor and the capacitive element is selected to, in combination with the inductor, provide the predetermined amount of inductance;
wherein the transmission line comprises a conductor over a ground plane on a printed circuit board in the form of a co-planar grounded waveguide, the capacitive element being mounted on the printed circuit board, and the capacitive element comprising a shorted waveguide electrically connected to the transmission line.

22. A method of matching an output impedance of an amplifier circuit to an input impedance of a transmission circuit, comprising:

providing a series combination of an inductor and a transmission line coupled between and in series with an output of the amplifier circuit and an input of the transmission circuit, the transmission line having a length selected, in combination with the inductor, to provide a predetermined amount of inductance, L, the transmission line comprising a conductor over a ground plane on a printed circuit board;

electrically coupling a first capacitive element to and in parallel with the output of the amplifier circuit, the capacitive element having a capacitance C, so that L and C provide an impedance substantially equal to an input impedance of the transmission circuit at a frequency;

the inductor having a first end connected to an output of the amplifier circuit and a second end connected to the transmission line, and the transmission line having a first end connected to the second end of the inductor and a second end connected to the impedance matching circuit, wherein the first capacitive element is electrically connected to the transmission line such that the length of the transmission line between the second end of the inductor and the first capacitive element is selected to, in combination with the inductor, provide the predetermined amount of inductance;

mounting the first capacitive element on the printed circuit board such that a first end of the capacitive element is electrically connected to the conductor of the transmission line and a second end of the first capacitive element is electrically connected to the ground plane;

electrically connecting a second capacitive element to the transmission line in parallel with the first capacitive element such that the length of the transmission line between the second end of the inductor and the second capacitive element is selected to, in combination with the inductor, provide a second predetermined amount of inductance, L', L' and C providing an impedance substantially equal to the input impedance of the transmission circuit at a second frequency; and electrically coupling the second capacitive element to the ground plane and electrically decoupling the first capacitive element from the ground plane through a single pole double throw switch capable of alternately electrically decoupling the first and second capacitive elements from the ground plane.

* * * * *